(12) United States Patent
Melanson

(10) Patent No.: US 7,288,902 B1
(45) Date of Patent: Oct. 30, 2007

(54) COLOR VARIATIONS IN A DIMMABLE LIGHTING DEVICE WITH STABLE COLOR TEMPERATURE LIGHT SOURCES

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/695,023

(22) Filed: Apr. 1, 2007

Related U.S. Application Data

(60) Provisional application No. 60/894,295, filed on Mar. 12, 2007.

(51) Int. Cl.
*G05F 1/00* (2006.01)

(52) U.S. Cl. ............... 315/291; 315/224; 315/309; 315/DIG. 4; 345/690; 323/905

(58) Field of Classification Search .. 315/169.3–169.4, 315/224, 291, 294, 297, 302, 307–309, 312, 315/DIG. 4; 362/84, 227, 555; 345/82, 345/102, 690; 323/905
See application file for complete search history.

(56) References Cited

U.S. PATENT DOCUMENTS

| | | | | |
|---|---|---|---|---|
| 4,414,493 | A * | 11/1983 | Henrich | 315/308 |
| 4,677,366 | A | 6/1987 | Wilkinson et al. | 323/222 |
| 4,940,929 | A | 7/1990 | Williams | 323/222 |
| 6,083,276 | A | 7/2000 | Davidson et al. | 717/1 |
| 6,211,627 | B1 * | 4/2001 | Callahan | 315/294 |
| 6,246,183 | B1 | 6/2001 | Buonavita | 315/248 |
| 6,509,913 | B2 | 1/2003 | Martin, Jr. et al. | 345/762 |
| 6,583,550 | B2 | 6/2003 | Iwasa et al. | 313/485 |
| 6,636,003 | B2 | 10/2003 | Rahm et al. | 315/179 |
| 6,713,974 | B2 | 3/2004 | Patchornik et al. | 315/295 |
| 6,781,351 | B2 | 8/2004 | Mednik et al. | 323/222 |
| 6,806,659 | B1 | 10/2004 | Mueller et al. | 315/295 |
| 6,860,628 | B2 | 3/2005 | Robertson et al. | 362/555 |

(Continued)

OTHER PUBLICATIONS

J. Qian et al., "New Charge Pump Power-Factor-Correction Electronic Ballast with a Wide Range of Line Input Voltage," IEEE Transactions on Power Electronics, vol. 14, No. 1, Jan. 1999.

(Continued)

*Primary Examiner*—Haissa Philogene
*Assistant Examiner*—Tung X Le
(74) *Attorney, Agent, or Firm*—Hamilton & Terrile, LLP; Kent B. Chambers

(57) ABSTRACT

A method and system allow a lighting device having light sources with multiple color temperatures to vary a color temperature of the lighting device in response to changing dimming levels. The light sources are non-incandescent light sources, such as light emitting diodes and/or gas-discharge lights. A dimmer circuit provides a dimming signal that indicates a selected dimming level. The lighting device includes a light source driver and a light source driver controller that cooperate to vary drive currents to the light sources in response to the selected dimming level. By varying the drive currents in different relative amounts, the color temperature of the lighting device changes in response to dimming level changes. In at least one embodiment, changes in the color temperature of the lighting device in response to the dimming level changes simulates the color temperature changes of an incandescent light source.

19 Claims, 7 Drawing Sheets

U.S. PATENT DOCUMENTS

| | | | |
|---|---|---|---|
| 6,870,325 B2* | 3/2005 | Bushell et al. | 315/224 |
| 6,940,733 B2 | 9/2005 | Schie et al. | 363/21.12 |
| 7,088,059 B2* | 8/2006 | McKinney et al. | 315/291 |
| 7,102,902 B1* | 9/2006 | Brown et al. | 363/89 |
| 2004/0228116 A1* | 11/2004 | Miller et al. | 362/84 |
| 2005/0275354 A1 | 12/2005 | Hausman, Jr. et al. | 315/291 |
| 2006/0022916 A1* | 2/2006 | Aiello | 345/82 |
| 2006/0023002 A1* | 2/2006 | Hara et al. | 345/690 |
| 2006/0261754 A1* | 11/2006 | Lee | 315/291 |
| 2007/0029946 A1* | 2/2007 | Yu et al. | 315/291 |
| 2007/0040512 A1* | 2/2007 | Jungwirth et al. | 315/159 |
| 2007/0053182 A1 | 3/2007 | Robertson | 362/228 |
| 2007/0182699 A1* | 8/2007 | Ha et al. | 345/102 |

OTHER PUBLICATIONS

P. Green, "A Ballast that can be Dimmed from a Domestic (Phase-Cut) Dimmer," IRPLCFL3 rev. b, International Rectifier, http://www.irf.com/technical-info/refdesigns/cfl-3.pdf, printed Mar. 24, 2007, Aug. 25, 2003.

J. Qian et al., "Charge Pump Power-Factor-Correction Technologies Part II: Ballast Applications," IEEE Transactions on Power Electronics, vol. 15, No. 1, Jan. 2000.

"Chromaticity Shifts in High-Power White LED Systems due to Different Dimming Methods," Solid-State Lighting, http://www.lrc.rpi.edu/programs/solidstate/completedProjects.asp?ID=76, printed May 3, 2007, no date.

Freescale Semiconductor, "Dimmable Light Ballast with Power Factor Correction," Designer Reference Manual, M68HC08 Microcontrollers, DRM067, Rev. 1, Dec. 2005.

S. Chan et al., "Design and Implementation of Dimmable Electronic Ballast Based on Integrated Inductor," IEEE Transactions on Power Electronics, vol. 22, No. 1, Jan. 2007.

M. Madigan et al., "Integrated High-Quality Rectifier-Regulators," IEEE Transactions on Industrial Electronics, vol. 46, No. 4, Aug. 1999.

T. Wu et al., "Single-Stage Electronic Ballast with Dimming Feature and Unity Power Factor," IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, "IQS17 Family, IQ Switch®—ProxSense™ Series, Touch Sensor, Load Control and User Interface," IQS17 Datasheet V2.00. doc, Jan. 2007.

C. DiLouie, "Introducing the LED Driver," EC&M, Sep. 2004.

S. Lee et al., "TRIAC Dimmable Ballast with Power Equalization," IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

"Why Different Dimming Ranges? The Difference Between Measured and Perceived Light," http://www.lutron.com/ballast/pdf/LutronBallastpg3.pdf, no date.

D. Hausman, "Real-Time Illumination Stability Systems for Trailing-Edge (Reverse Phase Control) Dimmers," Technical White Paper, Lutron, version 1.0, Dec. 2004, http://www.lutron.com/technical_info/pdf/RTISS-TE.pdf.

"Light Dimmer Circuits," www.epanorama.net/documents/lights/lightdimmer.html, printed Mar. 26, 2007, Nov. 18, 2004.

"Light Emitting Diode," http://en.wikipedia.org/wiki/Light-emitting_diode, printed Mar. 27, 2007, no date.

"Color Temperature," www.sizes.com/units/color_temperature.htm, printed Mar. 27, 2007, Oct. 10, 2002.

S. Lee et al., "A Novel Electrode Power Profiler for Dimmable Ballasts Using DC Link Voltage and Switching Frequency Controls," IEEE Transactions on Power Electronics, vol. 19, No. 3, May 2004.

Y. Ji et al., "Compatibility Testing of Fluorescent Lamp and Ballast Systems," IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

\* cited by examiner

COLOR VARIATIONS IN A DIMMABLE LIGHTING DEVICE WITH STABLE COLOR TEMPERATURE LIGHT SOURCES

CROSS-REFERENCE TO RELATED APPLICATION

This application claims the benefit under 35 U.S.C. § 119(e) and 37 C.F.R. § 1.78 of U.S. Provisional Application No. 60/894,295, filed Mar. 12, 2007 and entitled "Lighting Fixture". U.S. Provisional Application No. 60/894,295 includes exemplary systems and methods and is incorporated by reference in its entirety.

U.S. Provisional Application entitled "Ballast for Light Emitting Diode Light Sources", inventor John L. Melanson, 60/909,456, and filed on Mar. 31, 2007 describes exemplary methods and systems and is incorporated by reference in its entirety.

U.S. Provisional Application entitled "Multi-Function Duty Cycle Modifier", inventors John L. Melanson and John Paulos, 60/909,457, and filed on Mar. 31, 2007 describes exemplary methods and systems and is incorporated by reference in its entirety.

U.S. patent application entitled "Lighting System with Lighting Dimmer Output Mapping", inventors John L. Melanson and John Paulos, 60/909,457, and filed on Mar. 31, 2007 describes exemplary methods and systems and is incorporated by reference in its entirety.

BACKGROUND OF THE INVENTION

1. Field of the Invention

The present invention relates in general to the field of electronics and lighting, and more specifically to a system and method for varying colors in a dimmable lighting device using stable color temperature light sources.

2. Description of the Related Art

Commercially practical incandescent light bulbs have been available for over 100 years. However, other light sources show promise as commercially viable alternatives to the incandescent light bulb. Gas discharge light sources, such as fluorescent, mercury vapor, low pressure sodium, and high pressure sodium lights and electroluminescent light sources, such as a light emitting diode (LED), represent two categories of light source alternatives to incandescent lights. LEDs are becoming particularly attractive as main stream light sources in part because of energy savings through high efficiency light output and environmental incentives such as the reduction of mercury.

Incandescent lights generate light by passing current through a filament located within a vacuum chamber. The current causes the filament to heat and produce light. The filament produces more heat as more current passes through the filament. For a clear vacuum chamber, the temperature of the filament determines the color of the light. A lower temperature results in yellowish tinted light and a high temperature results in a bluer, whiter light.

Gas discharge lamps include a housing that encloses gas. The housing is terminated by two electrodes. The electrodes are charged to create a voltage difference between the electrodes. The charged electrodes heat and cause the enclosed gas to ionize. The ionized gas produces light. Fluorescent lights contain mercury vapor that produces ultraviolet light. The housing interior of the fluorescent lights include a phosphor coating to convert the ultraviolet light into visible light.

LEDs are semiconductor devices and are driven by direct current. The lumen output intensity (i.e. brightness) of the LED varies in direct proportion to the current flowing through the LED. Thus, increasing current supplied to an LED increases the intensity of the LED, and decreasing current supplied to the LED dims the LED. Current can be modified by either directly reducing the direct current level to the white LEDs or by reducing the average current through pulse width modulation.

The color characteristic of light is the measure of the distribution of power over the visible spectrum. The visible spectrum has a wavelength range of approximately 400 nanometers (violet) to 700 nanometers (red). The color characteristic of light is commonly defined in terms of color temperature. Thus, although the light emitted by a light source has energy spread among multiple frequencies, the light is perceived to have a particular color that can be defined in terms of a particular color temperature. Table 1 depicts an exemplary correlation between a particular light source and the color temperature of the light source.

TABLE 1

| Light Source | Color temperature (Kelvin) |
| --- | --- |
| Skylight (bluesky) | 12,000-20,000 |
| Average summer shade | 8000 |
| Light summer shade | 7100 |
| Typical summer light (sun + sky) | 6500 |
| Daylight fluorescent | 6300 |
| Xenon short-arc | 6400 |
| Overcast sky | 6000 |
| Clear mercury lamp | 5900 |
| Sunlight (noon, summer, mid-latitudes) | 5400 |
| Design white fluorescent | 5200 |
| Special fluorescents used for color evaluation | 5000 |
| Daylight photo flood | 4800-5000 |
| Sunlight (early morning and late afternoon) | 4300 |
| Brite White Deluxe Mercury lamp | 4000 |
| Sunlight (1 hour after dawn) | 3500 |
| Cool white fluorescent | 3400 |
| Photo flood | 3400 |
| Professional tungsten photographic lights | 3200 |
| 100-watt tungsten halogen | 3000 |
| Deluxe Warm White fluorescent | 2950 |
| 100-watt incandescent | 2870 |
| 40-watt incandescent | 2500 |
| High-pressure sodium light | 2100 |
| Sunlight (sunrise or sunset) | 2000 |
| Candle flame | 1850-1900 |
| Match flame | 1700 |

Dimming a light source saves energy when operating a light source and also allows a user to adjust the intensity of the light source to a desired level. Many facilities, such as homes and buildings, include light source dimming circuits (referred to herein as a "dimmer").

FIG. 1 depicts a lighting circuit 100 with a conventional dimmer 102 for dimming incandescent light source 104 in response to inputs to variable resistor 106. The dimmer 102, light source 104, and voltage source 108 are connected in series. Voltage source 108 supplies alternating current at line voltage $V_{line}$. The line voltage $V_{line}$ can vary depending upon geographic location. The line voltage $V_{line}$ is typically 110-120 Vac or 220-240 Vac with a typical frequency of 60 Hz or 70 Hz. Instead of diverting energy from the light source 104 into a resistor, dimmer 102 switches the light source 104 off and on many times every second to reduce the total amount of energy provided to light source 104. A user can select the resistance of variable resistor 106 and, thus, adjust the charge time of capacitor 110. A second, fixed resistor 112 provides a minimum resistance when the variable resistor 106 is set to 0 ohms. When capacitor 110 charges to a voltage greater than a trigger voltage of diac 114, the diac 114 conducts and the gate of triac 116 charges. The resulting voltage at the gate of triac 116 and across bias resistor 118 causes the triac 116 to conduct. When the current I passes through zero, the triac 116 becomes nonconductive, i.e. turns 'off'). When the triac 116 is nonconductive, the dimmer output voltage $V_{DIM}$ is 0V. When triac 116 conducts, the dimmer output voltage $V_{DIM}$ equals the line voltage $V_{line}$. The charge time of capacitor 110 required to charge capacitor 110 to a voltage sufficient to trigger diac 114 depends upon the value of current I. The value of current I depends upon the resistance of variable resistor 106 and resistor 112. Thus, adjusting the resistance of variable resistor 106 adjusts the phase angle of dimmer output voltage $V_{DIM}$. Adjusting the phase angle of dimmer output voltage $V_{DIM}$ is equivalent to adjusting the phase angle of dimmer output voltage $V_{DIM}$. Adjusting the phase angle of dimmer output voltage $V_{DIM}$ adjusts the average power to light source 104, which adjusts the intensity of light source 104.

FIG. 2 depicts a spectral power distribution graph 200 representing changes in spectral power distribution over the visible spectrum for a white LED, green LED, and incandescent light sources for high and low drive currents. A light source is dimmed by decreasing the drive current supplied to the light source. Dimming an incandescent light source results in a dramatic change of spectral power distribution and, thus, results in a dramatic change in color temperature. For example, dimming a 100W incandescent light bulb by 75% of full intensity results in a color change from bluish-white to shade of yellow, such as amber. Reducing the current to an LED, such as a green and white LED, reduces the intensity of the LED, but the spectral power distribution remains essentially the same. Thus, the color temperature of an LED changes very little. Gas discharge lights exhibit a behavior very similar to LEDs for various dimming levels.

FIG. 3 depicts a graphical relationship 300 between dimming levels and color temperatures for a non-incandescent light source. The color temperature of a lighting device having non-incandescent light sources can be changed by varying a mix of non-incandescent light sources. However, regardless of the mix of non-incandescent light sources in a lighting device, varying the dimming level to the lighting device changes the intensity of the light sources not the color temperature of the lighting device.

Although lighting devices having one or more non-incandescent light sources can be dimmed, dimming non-incandescent light sources does not result in familiar color temperature changes associated with incandescent light sources.

SUMMARY OF THE INVENTION

In one embodiment of the present invention, a lighting device includes two input terminals to receive a dimmer signal from a dimmer and alternating current (AC) power, wherein the dimmer signal indicates a dimming level. The lighting device also includes a first light source having a stable first color temperature and a second light source having a stable second color temperature. The lighting device further includes a light source driver, coupled to the first light source and the second light source and to the input terminals to supply a first drive current to the first light source and a second drive current to the second light source. The lighting device also includes a light source driver controller, coupled to the light source driver, to cause the light source driver to vary the first and second drive currents in response to changes in the dimming level indicated by the dimmer signal, wherein varying the first and second drive currents varies a color temperature of the lighting device.

In another embodiment of the present invention, a method of varying a color temperature of a lighting device includes receiving a dimmer signal on at least one of N input terminals, wherein the dimmer input signal indicates multiple dimming levels over time and N is a positive integer less than or equal to four (4) and receiving power from a voltage source on at least two of the N input terminals. The method further includes supplying a first drive current to a first light source, wherein the first light source has a stable first color temperature and supplying a second drive current to a second light source, wherein the second light source has a stable second color temperature. The method also includes varying the first and second drive currents in response to changes in the dimming levels, wherein varying the first and second drive currents varies a color temperature of the lighting device.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A method and system allow a lighting device having light sources with multiple color temperatures to vary a color temperature of the lighting device in response to changing dimming levels. The light sources are non-incandescent light sources, such as light emitting diodes and/or gas-discharge lights. A dimmer circuit provides a dimming signal that indicates a selected dimming level. The lighting device includes a light source driver and a light source driver controller that cooperate to vary drive currents to the light sources in response to the selected dimming level. By varying the drive currents in different relative amounts, the color temperature of the lighting device changes in response to dimming level changes. In at least one embodiment, changes in the color temperature of the lighting device in response to the dimming level changes simulates the color temperature changes of an incandescent light source. The components of the lighting device can be housed in a single housing and input terminals of the lighting device can connect directly to a dimmer, and, thus, receive power and the dimming signal through between, for example, 2 and 4 wires depending upon the configuration of the dimmer.

Figure 4:
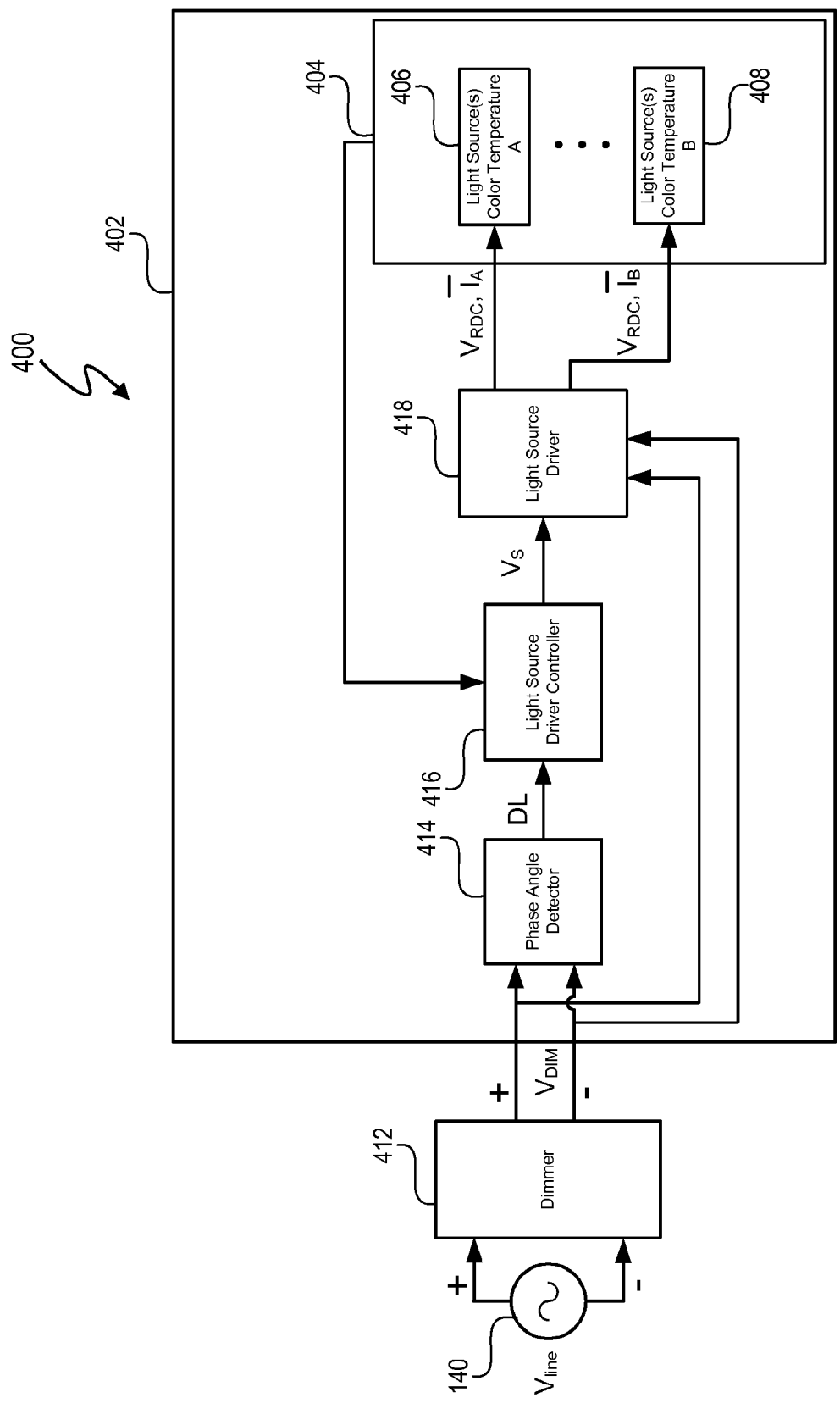
FIG. 4 depicts a lighting device with multiple light sources having different color temperatures.

FIG. 4 depicts a lighting system 400 that includes a lighting device 402 with light sources of different color temperatures, and the lighting device 402 responds to various dimming levels with changes in color temperature. The lighting device 402 includes a light source bank 404 having light sources with at least two color temperatures. In at least one embodiment, any variance of the color temperatures of the individual light sources in light source bank 404 with intensity is substantially imperceptible to an unaided human eye. In at least one embodiment, the light sources in light source bank 404 are LEDs, gas-discharge light sources, or a mixture of LEDs and gas-discharge light sources. In at least one embodiment, light source bank 404 includes light source (s) 406 and light source(s) 408. Light source(s) 406 includes at least one light source with a stable color temperature "A". Light source(s) 408 include at least one light source with a stable color temperature "B". A color temperature of a light source is stable if the color temperature does not significantly vary with a full-scale change of intensity of the light source. For example, as drive current to a light source varies in response to various dimming levels, the color temperature of the light source remains substantially constant. Light source bank 404 can include additional light sources of the same or different color temperatures.

The particular number of light sources and the particular mix of color temperatures of the light sources is a matter of design choice and depends upon the desired intensity levels of the light source in response to dimming and the desired color temperatures of the light source in response to dimming. In general, increasing the number of light sources increases the range of intensity levels achievable by the light source. Changing the mix of color temperatures by adding light sources with additional color temperatures or modifying a ratio of one or more light sources with particular color temperatures determines the range of color temperatures achievable by the lighting device in response to dimming.

Figure 1:
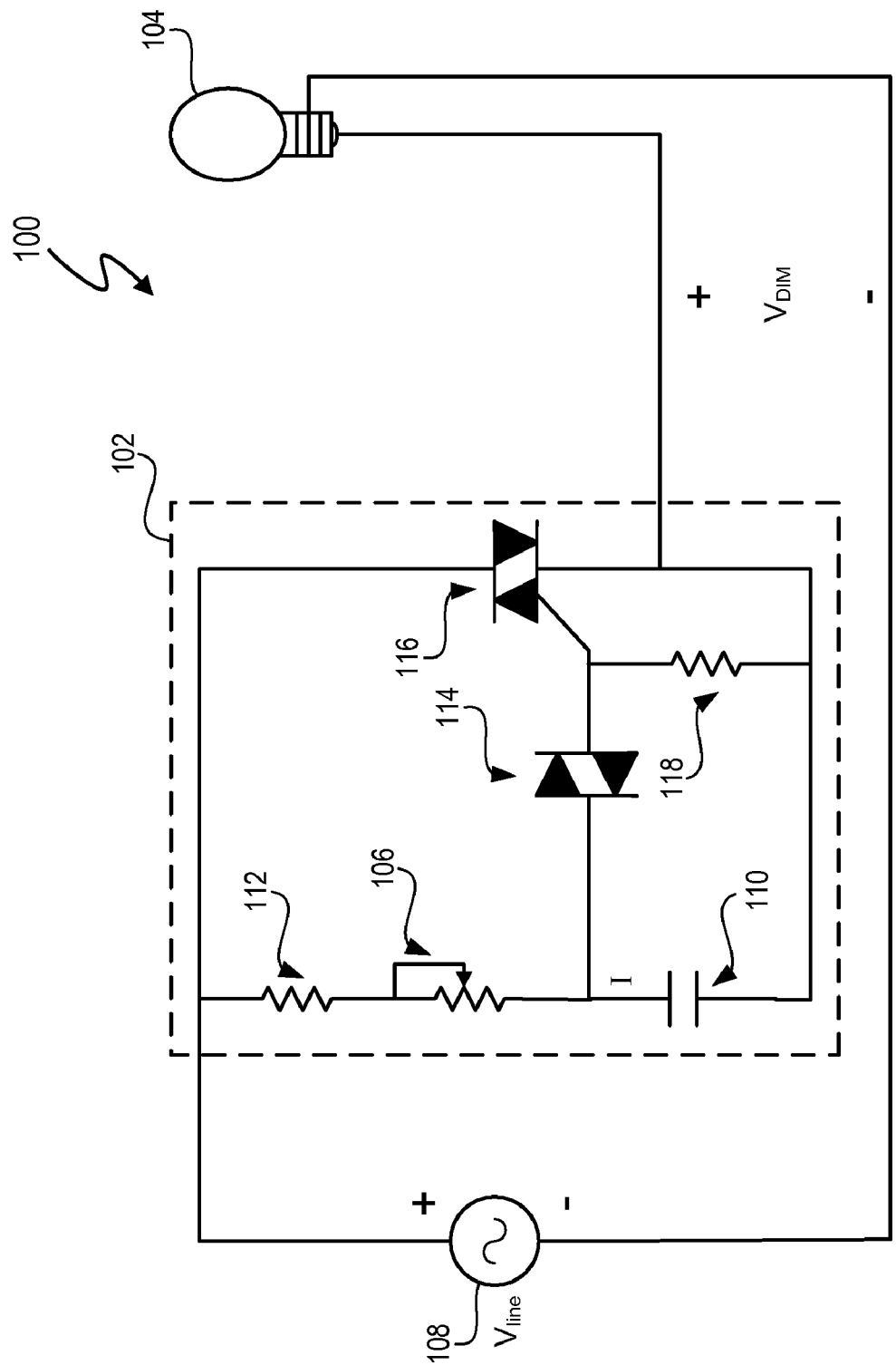
FIG. 1 (labeled prior art) depicts a lighting circuit with a conventional dimmer for dimming incandescent lamp.
Figure 2:
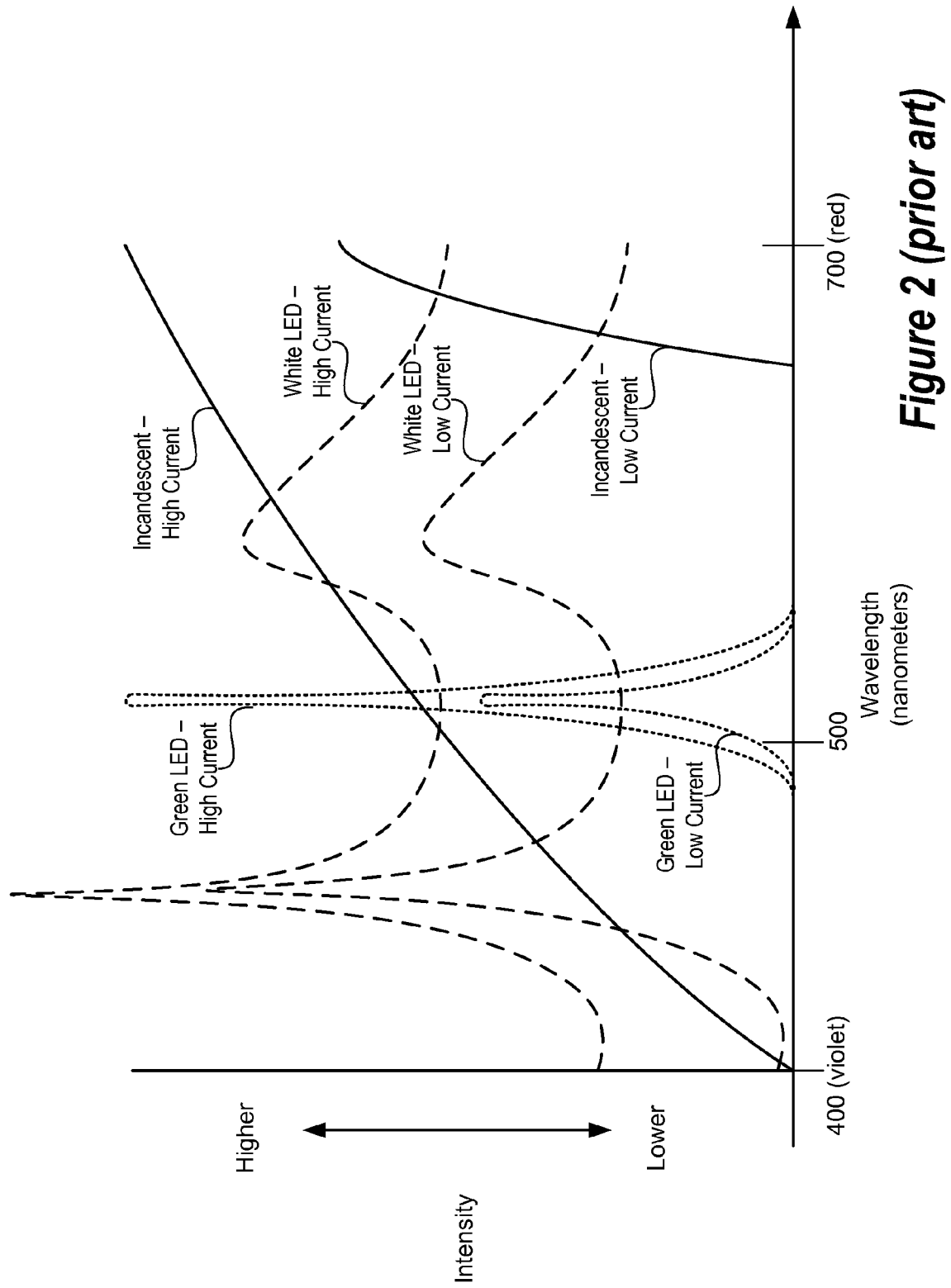
FIG. 2 (labeled prior art) depicts a spectral power distribution graph over the visible spectrum.
Figure 3:
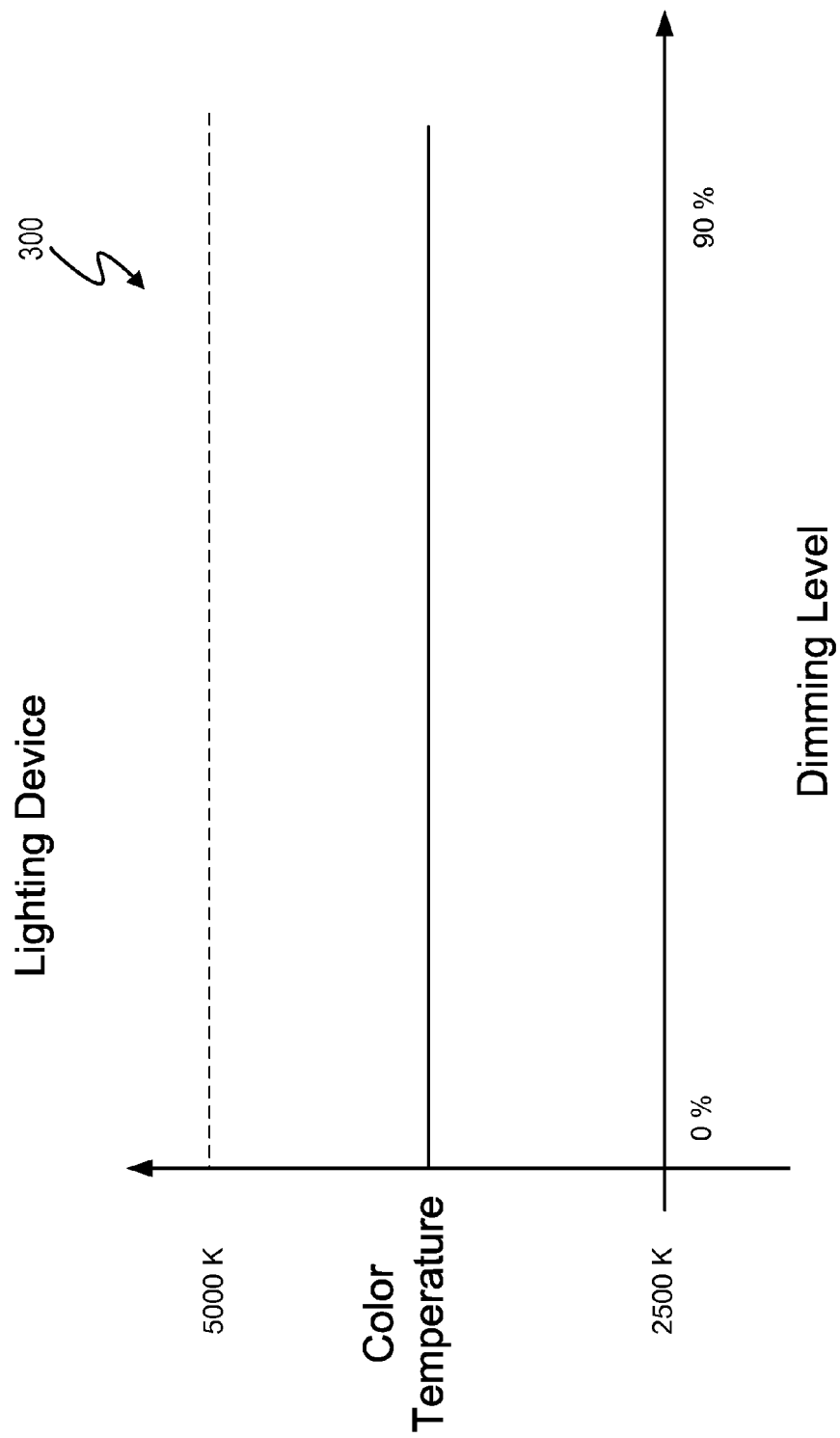
FIG. 3 (labeled prior art) depicts a graphical relationship between dimming levels and color temperatures for a non-incandescent light source.

During operation, the lighting device 402 is connected to a power source. In at least one embodiment, the power source 140 is a line voltage $V_{line}$, which is, for example, an alternating current (AC), 110-140 Vac, 60 Hz voltage. Often, the available line voltage $V_{line}$ is location specific. A dimmer circuit (dimmer) 412 provides a dimmer voltage $V_{DIM}$ to phase angle sensor 414. In at least one embodiment, dimmer 412 is a conventional dimmer, such as conventional dimmer 102 (FIG. 1) or a microcontroller based dimmer.

The phase angle of dimmer voltage $V_{DIM}$ indicates a dimming level. In at least one embodiment, a user selects a dimmer voltage phase angle using a control (not shown), such as a slider, push button, or remote control, to select the dimming level. In at least one embodiment, the dimmer voltage is a periodic AC voltage. In at least one embodiment, in response to a dimming level selection, dimmer 412 chops the line voltage $V_{line}$ to modify a phase angle of the dimmer voltage $V_{DIM}$. The phase angle of the dimmer voltage $V_{DIM}$ corresponds to the selected dimming level. The phase angle detector 414 detects the phase angle of dimmer voltage $V_{DIM}$ and provides a corresponding dimming level signal DL to the light source driver controller 416. In at least one embodiment, the phase angle detector 414 includes a timer circuit that uses an oscillator signal having a known frequency, $f_{osc}$, and a comparator to compare the dimmer voltage $V_{DIM}$ to a neutral reference. The dimmer voltage $V_{DIM}$ has a known frequency. The phase angle detector 414 determines the phase angle of dimmer voltage $V_{DIM}$ by counting the number of cycles of frequency $f_{osc}$ that occur until the chopping point of dimmer voltage $V_{DIM}$ is detected by the comparator. In another embodiment, an analog integrator can be used to detect the power in the dimmer voltage $V_{DIM}$, which is directly related to the phase angle of the dimmer voltage $V_{DIM}$. In another embodiment, both the leading and trailing edges of dimmer voltage $V_{DIM}$ can be chopped. U.S. Pat. No. 6,713,974, entitled "Lamp Transformer For Use With An Electronic Dimmer And Method For Use Thereof For Reducing Acoustic Noise", inventors Patchornik and Barak, describes an exemplary system and method for leading and trailing edge dimmer voltage $V_{DIM}$ chopping and edge detection. U.S. Pat. No. 6,713,974 is incorporated herein by reference in its entirety. U.S. Provisional Application entitled "Ballast for Light Emitting Diode Light Sources", inventor John L. Melanson, 60/909,456, and filed on Mar. 31, 2007 describes an exemplary light source driver controller 416.

The light source driver 418 supplies a raw direct current (DC) voltage $V_{RDC}$ across the white light source(s) 406 and the yellow light source(s) 408. The light source driver 418 also supplies one or more drive currents $I_A$ to the light source(s) 406 and one or more drive currents $I_B$ to the light source(s) 408. Each light source or group of light sources to be controlled independently from one or more other light sources in light source bank 404 is supplied a separate drive current. For example, if light source(s) 406 includes two separate light sources, light source driver 418 can supply separate drive currents, $I_{A1}$ and $I_{A2}$, to the respective light source(s) 406, or light source driver 418 can supply the same drive current $I_A$ to the respective light source(s) 406. In the first embodiment, drive current $I_A=\{I_{A1}, I_{A2}\}$. The same drive current supply scheme also applies to the one or more drive currents $I_B$ to drive light source(s) 408. The number of light sources in light source bank 404 to be controlled independently is a matter of design choice and depends, for example, on the desired range of colors and range of intensity for lighting device 402.

The light source driver controller 416 translates the dimming level signal DL into control signals $V_S$ to vary the drive currents $I_A$ and $I_B$ to vary a color output of the light source 100 from, for example, white towards a shade of yellow as the dimmer signal indicates an increase in dimming. The control signals $V_S$ cause light source driver 418 to change the intensity of light sources in light source bank 404 by varying the drive currents $I_A$ and $I_B$. The drive currents can be varied using, for example, pulse width modulation (PWM) to vary the average value of drive currents $I_A$ and $I_B$ over time. When using PWM, the control signals $V_S$ control respective switches that control the respective supply of drive currents $I_A$ and $I_B$. The PWM frequency can be increased to a point that avoids any human perceptible flicker in the light output of light source bank 404. In at least one embodiment, the PWM frequency can be varied to spread the spectrum of the fundamental and harmonic switching frequencies to minimize radio frequency interference. In at least one embodiment, the PWM frequency can also correspond to the dimming level signal DL so that, for example, as the dimming level approaches 100%, the PWM frequency is set to intentionally allow human perception of flickering of one or more light sources in light source bank 404 to simulate, for example, the flicker of a candle.

Figure 5:
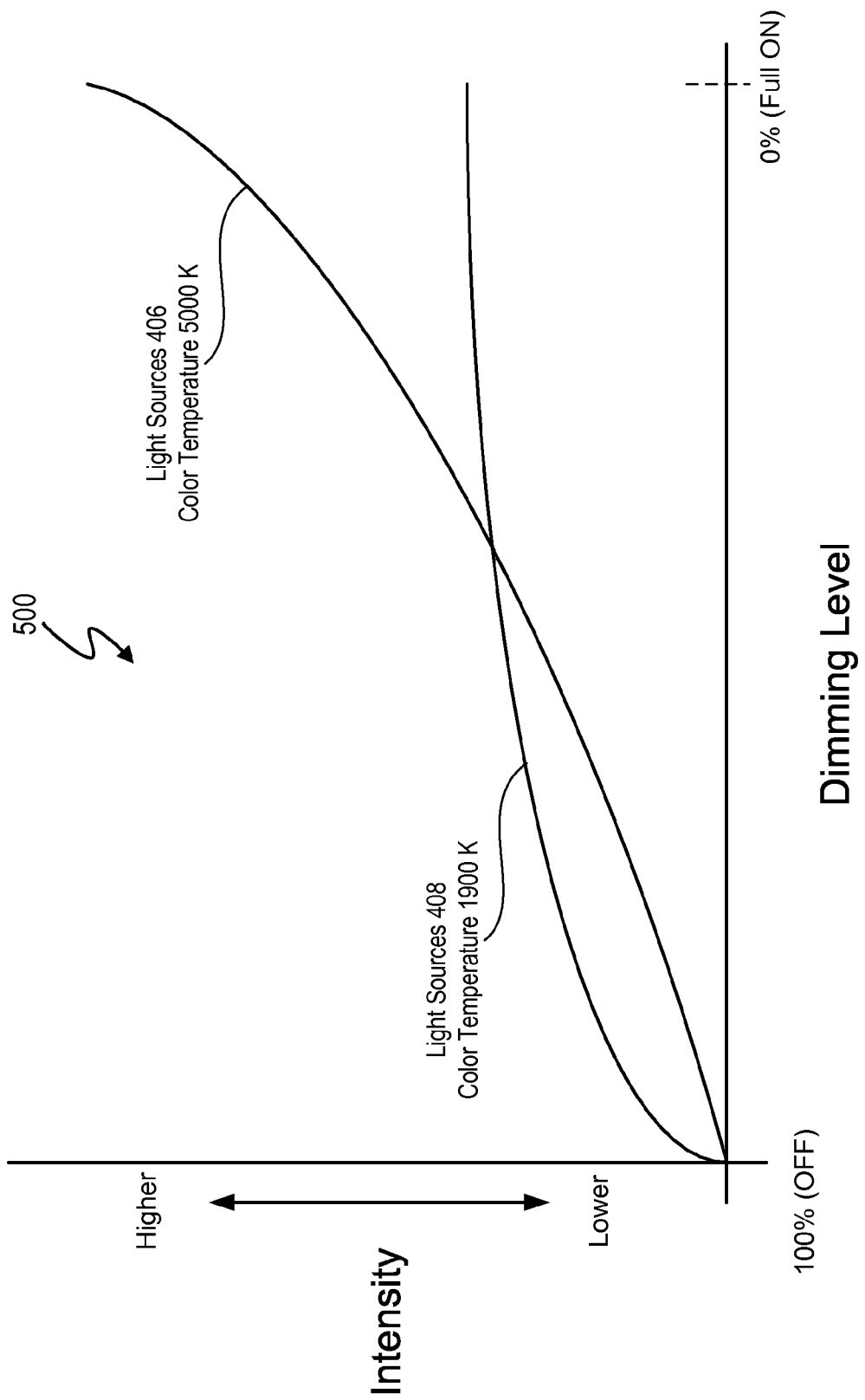
FIG. 5 depicts a graphical relationship between dimming levels and a distribution of color temperatures at various intensities.
Figure 6:
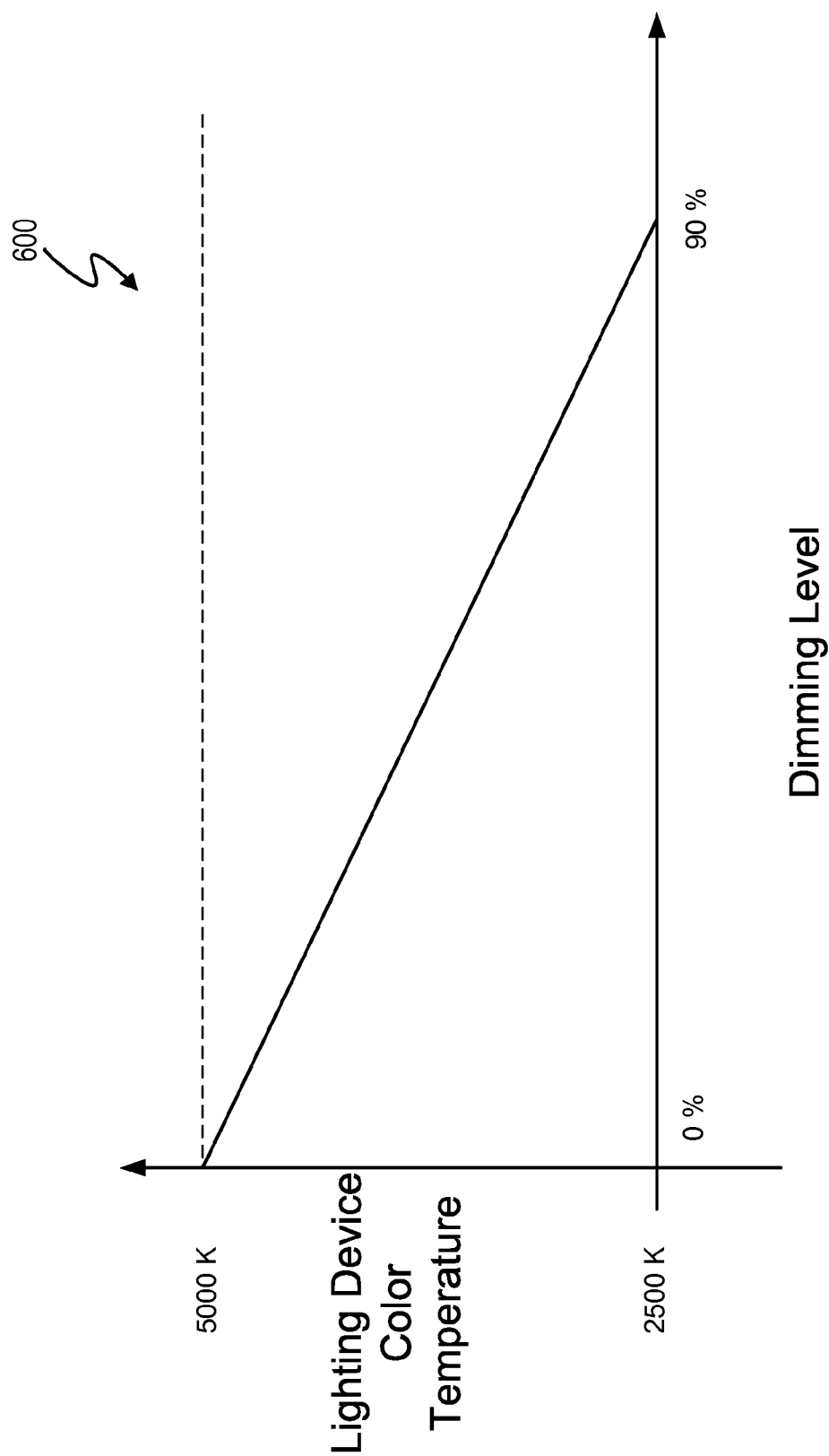
FIG. 6 depicts a graphical relationship between dimming levels and color temperatures for a lighting device.

FIG. 5 depicts an exemplary graphical relationship 500 between dimming levels and a distribution of color temperatures at various intensities for lighting device 402. The light source driver controller 416 can cause lighting device 402 to simulate an incandescent lamp by selecting different intensity combinations for the light source(s) 406 and light source(s) 408 that correspond to the color temperature of the incandescent lamp as dimming levels change. For example, at 0% dimming level (100% intensity), the light source driver controller 416 provides control signals $V_S$ to light source driver 418 that cause light source driver 418 to vary the drive currents $I_A$ and $I_B$ so that all the light sources in light source bank 404 operate at 100% intensity (i.e. the full rated intensity for the light source). In this embodiment, the number of light sources 406 is greater than the number of light sources 408 so the intensity of light sources 406 is greater than the intensity of light sources 408 at 100% intensity. In at least one embodiment, the color temperature of light source(s) 406 is 5000 K and the color temperature of light source(s) 408 is 2500 K. In another embodiment, at a 0% dimming level, light source driver controller 416 causes only the light source(s) 406 to operate at full intensity and the light source(s) 408 are turned 'off'. For intervening dimming levels between 0% and 100%, the light source driver controller 416 provides control signals $V_S$ to light source driver 418 that cause light source driver 418 to vary the drive currents $I_A$ and $I_B$ to mix the intensities of light source(s) 406 and light source(s) 408 to provide the color temperature transitions as, for example, indicated by the graphical representation 600 (FIG. 6). The relationship between drive currents $I_A$ and $I_B$ with respect to a range of dimming levels is a matter of design choice and can have any relationship such as non-linear, linear, directly proportional, or indirectly proportional. As the dimming level approaches a 100% dimming level, the light source driver controller 416 can provide control signals $V_S$ to light source driver 418 that cause light source driver 418 to vary the drive current $I_A$ in a non-linear relationship with drive current $I_B$ so that the intensity of light source(s) 406 is significantly reduced and one or more of the light source(s) 408 are driven to a desired intensity to simulate the intensity and color output of a fully dimmed incandescent light. In at least one embodiment, at a 100%, all drive currents can be turned off.

The lighting device 402 can be completely enclosed within a housing such as a conventional appearing lamp housing. The input terminals of lighting device can be configured to be completely compatible with conventional or other standard light sockets. The phase angle sensor 414, the light source driver controller 416, the light source driver 418, and the light source bank 404 can be implemented as a single semiconductor integrated circuit (IC), separate semiconductor ICs, or collected into any combination of semiconductor ICs. Additionally, discrete components can be coupled to any of the phase angle sensor 414, the light source driver controller 416, the light source driver 418, and the light source bank 404. The dimmer 412 can be packaged separately or with any combination of the phase angle detector 414, the light source driver controller 416, the light source driver 418, and the light source bank 404.

FIG. 6 depicts an exemplary graphical relationship 600 between dimming levels and color temperatures for lighting device 400. As the dimming level increases the color temperature of lighting device 400 decreases from 5000 K to 2500 K. Graphical relationship 600 is depicted as a linearly increasing relationship but can, in other embodiments, represent any desired function, such as an exponentially increasing or decreasing relationship. The exact color transitions are designed to simulate color shift transitions in an incandescent lamp as dimming levels increase.

Figure 7:
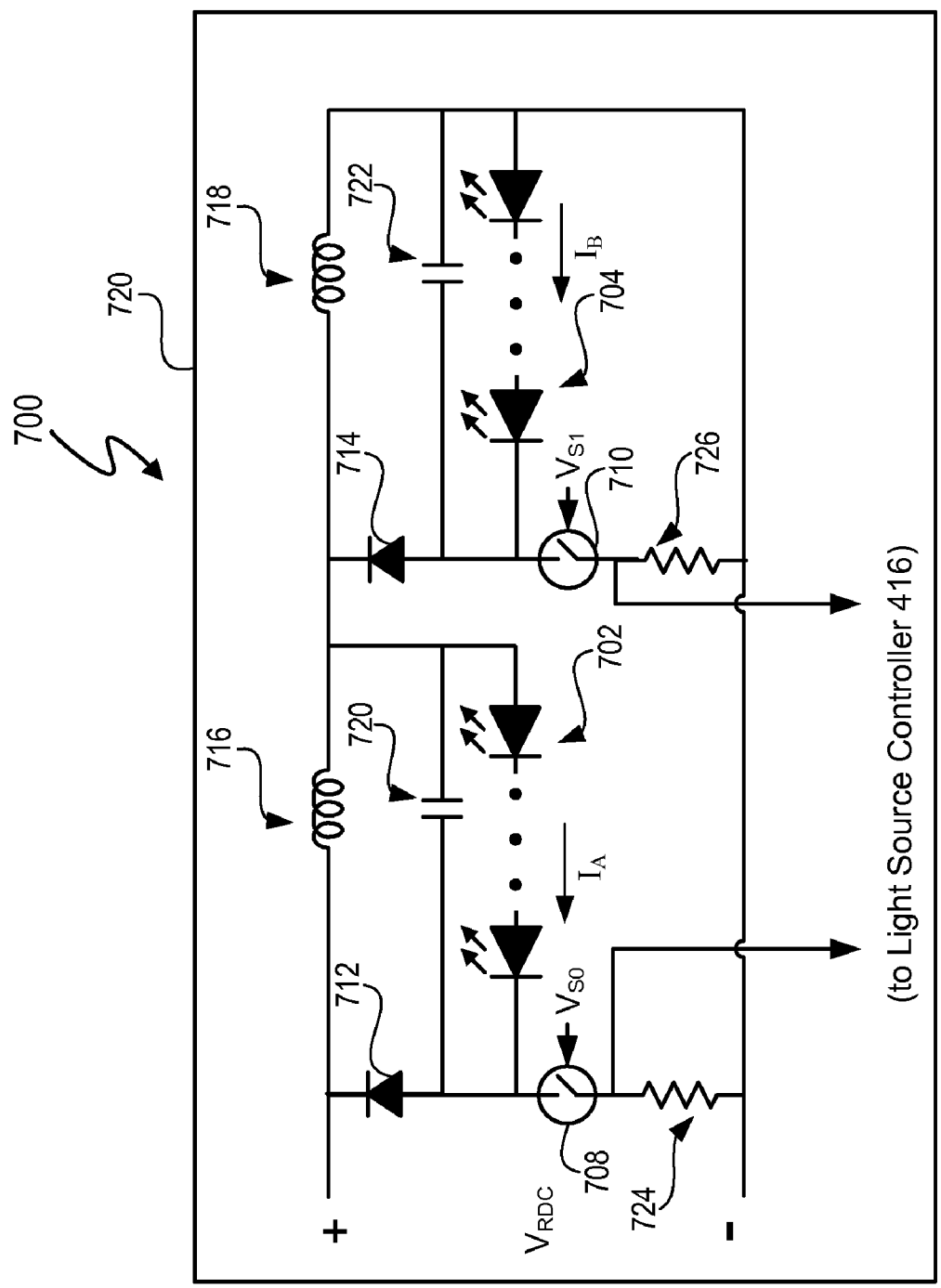
FIG. 7 depicts a bank of LEDs with multiple color temperatures.

FIG. 7 depicts an LED bank 700, which represents one embodiment of light source bank 404. The raw DC voltage $V_{RDC}$ is applied across the series connected LEDs 702 and the LEDs 704. Light source driver controller 416 supplies control signals $V_{S0}$ and $V_{S1}$ to turn respective switches 708 and 710 'on' (conductive) and 'off' (nonconductive). In at least one embodiment, switches 718 and 710 are n-channel field effect transistors (FETs). In this embodiment, light source driver controller 416 provides the gate voltages to switches 718 and 710. The average value of the drive currents $I_A$ and $I_B$ controls the intensity of LEDs 702 and 704. The diodes 712 and 714 permit current flow in only one direction. Inductors 716 and 718 and capacitors 420 and 422 regulate the voltage across the respective LEDs 702 and LEDs 704 and provide filtering. The voltage across resistors 724 and 726 is fed back to light source controller 416 to allow light source controller to adjust the switching frequency of switches 708 and 710 and, thus, correlate drive currents $I_A$ and $I_B$ with the selected dimming level. The number and arrangement of LEDs in LED bank 700 is a matter of design choice and depends, for example, on the range of desired intensity and color temperatures of LED bank 700.

In at least one embodiment, LED bank 700 includes multiple white LEDs 702 and multiple yellow LEDs 704. The ratio of white LEDs 702 to yellow LEDs 704 is a matter of design choice and depends, for example, on the desired color spectrum output of the lighting device 400 over a full range of dimming levels. In at least one embodiment, the ratio of white LEDs 702 to yellow LEDs 704 is 10 to 1. The total number of white LEDs 702 and yellow LEDs 704 is also a matter of design choice and depends, for example, on the desired intensity of lighting system 400. LED bank 700 can be located in a housing 720. The housing 720 can be decorative, such as a trough lighting housing, with multiple strings of LEDs arranged in a linear pattern, circular pattern, or any desired arrangement.

Thus, varying the drive currents to a bank of LEDs in response to a dimming level signal from a dimmer allows the lighting device 400 to change color temperature using lighting sources having stable color temperatures.

Although the present invention has been described in detail, it should be understood that various changes, substitutions and alterations can be made hereto without departing from the spirit and scope of the invention as defined by the appended claims.

What is claimed is:

1. A lighting device comprising:
   two input terminals to receive a dimmer signal from a dimmer and alternating current (AC) power, wherein the dimmer signal indicates a dimming level;
   a first light source having a stable first color temperature;
   a second light source having a stable second color temperature;
   a light source driver, coupled to the first light source and the second light source and to the input terminals to supply a first drive current to the first light source and a second drive current to the second light source; and
   a light source driver controller, coupled to the light source driver, to cause the light source driver to vary the first and second drive currents in response to changes in the dimming level indicated by the dimmer signal, wherein varying the first and second drive currents varies a color temperature of the lighting device.

2. The lighting device of claim 1 further comprising:
   a phase angle detector to detect phase angles of the dimmer signal to determine the dimming level.

3. The lighting device of claim 1 further comprising:
   a housing that encloses the first light source, the second light source, the light source driver, and the light source driver controller, wherein the N input terminals extend through the housing.

4. The lighting device of claim 1 wherein the lighting device is configured to be located within a trough light fixture.

5. The lighting device of claim 1 further comprising:
wherein the first light source comprises multiple white LEDs and the second light source comprises multiple yellow LEDs.

6. The lighting device of claim 1 wherein the first light source comprises at least one lamp having the first color temperature and the second light source comprises at least one lamp having the second color temperature.

7. The lighting device of claim 6 wherein the lamps are gas discharge lamps.

8. The lighting device of claim 6 wherein the lamps are light emitting diodes.

9. The lighting device of claim 6 wherein the first light source comprises multiple lamps having the first color temperature and the second light source comprises multiple lamps having the second color temperature.

10. A method of varying a color temperature of a lighting device, the method comprising:
receiving a dimmer signal on at least one of N input terminals, wherein the dimmer input signal indicates multiple dimming levels over time and N is a positive integer less than or equal to four (4);
receiving power from a voltage source on at least two of the N input terminals;
supplying a first drive current to a first light source, wherein the first light source has a stable first color temperature;
supplying a second drive current to a second light source, wherein the second light source has a stable second color temperature;
varying the first and second drive currents in response to changes in the dimming levels, wherein varying the first and second drive currents varies a color temperature of the lighting device.

11. The method of claim 10 further comprising:
detecting phase angles of the dimmer signal to determine the dimming levels.

12. The method of claim 10 wherein the lighting device is located within a single housing.

13. The method of claim 10 wherein the lighting device is configured to be located within a trough light fixture.

14. The method of claim 10 wherein the first light source comprises multiple white LEDs and the second light source comprises multiple yellow LEDs.

15. The method of claim 10 wherein the first light source comprises at least one lamp having the first color temperature and the second light source comprises at least one lamp having the second color temperature.

16. The method of claim 15 wherein the lamps are gas discharge lamps.

17. The method of claim 15 wherein the lamps are light emitting diodes.

18. The method of claim 15 wherein the first light source comprises multiple lamps having the first color temperature and the second light source comprises multiple lamps having the second color temperature.

19. The method of claim 10 wherein varying the first and second drive currents in response to changes in the dimming levels comprises varying the first drive current in an indirect proportion to the second drive current.

* * * * *